(12) United States Patent
Kim et al.

(10) Patent No.: US 7,666,742 B2
(45) Date of Patent: Feb. 23, 2010

(54) METHOD OF FABRICATING SEMICONDUCTOR DEVICES HAVING A RECESSED ACTIVE EDGE

(75) Inventors: Yong-Il Kim, Gyeonggi-do (KR); Min-Hee Cho, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 138 days.

(21) Appl. No.: 11/462,949

(22) Filed: Aug. 7, 2006

(65) Prior Publication Data
US 2007/0029619 A1  Feb. 8, 2007

(30) Foreign Application Priority Data
Aug. 5, 2005   (KR) ...................... 10-2005-0071915

(51) Int. Cl.
*H01L 21/336* (2006.01)
(52) U.S. Cl. .................. 438/270; 438/296; 257/330; 257/E21.429
(58) Field of Classification Search ................ 438/270, 438/296; 257/330, 396, E21.429
See application file for complete search history.

(56) References Cited

U.S. PATENT DOCUMENTS

| | | | |
|---|---|---|---|
| 6,611,027 B2 | 8/2003 | Ichikawa | |
| 6,844,591 B1 * | 1/2005 | Tran | 257/330 |
| 2003/0085435 A1 * | 5/2003 | Wang | 257/396 |
| 2004/0072412 A1 * | 4/2004 | Kim | 438/589 |
| 2005/0040475 A1 | 2/2005 | Jang et al. | |
| 2005/0087832 A1 * | 4/2005 | Park | 257/506 |

FOREIGN PATENT DOCUMENTS

KR   10-2005-0010152   1/2005

* cited by examiner

*Primary Examiner*—Steven J Fulk
(74) *Attorney, Agent, or Firm*—Volentine & Whitt, PLLC

(57) ABSTRACT

A semiconductor device having a recessed active edge is provided. The semiconductor devices include an isolation layer disposed in a substrate to define an active region. A gate electrode is disposed to cross over the active region. A source region and a drain region are disposed in the active region on both sides of the gate electrode. A recessed region is disposed under the gate electrode and on an edge of the active region adjacent to the isolation layer. A bottom of the recessed region may be sloped down toward the isolation layer. The gate electrode may further extend into and fill the recessed region. That is, a gate extension may be disposed in the recessed region. A method of fabricating the semiconductor device is also provided.

12 Claims, 16 Drawing Sheets

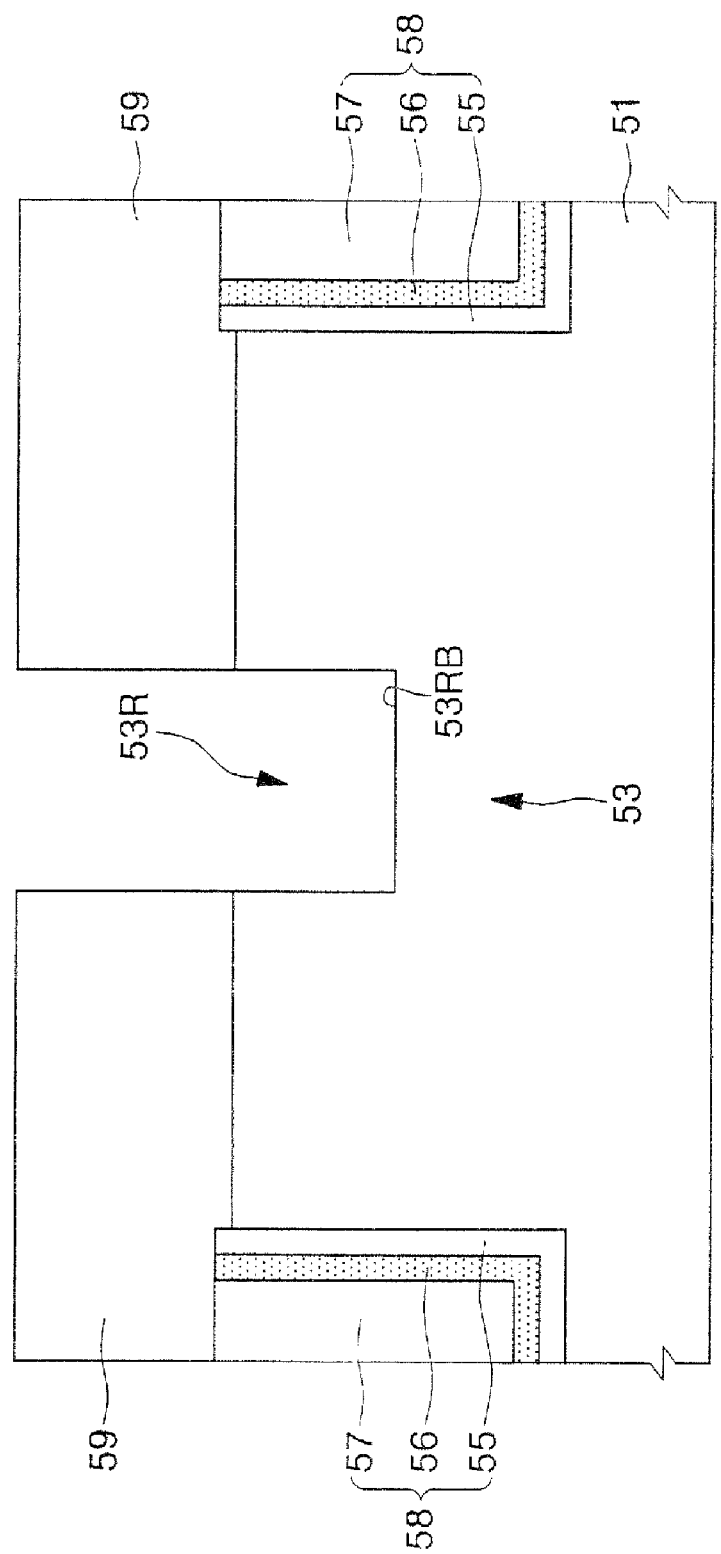

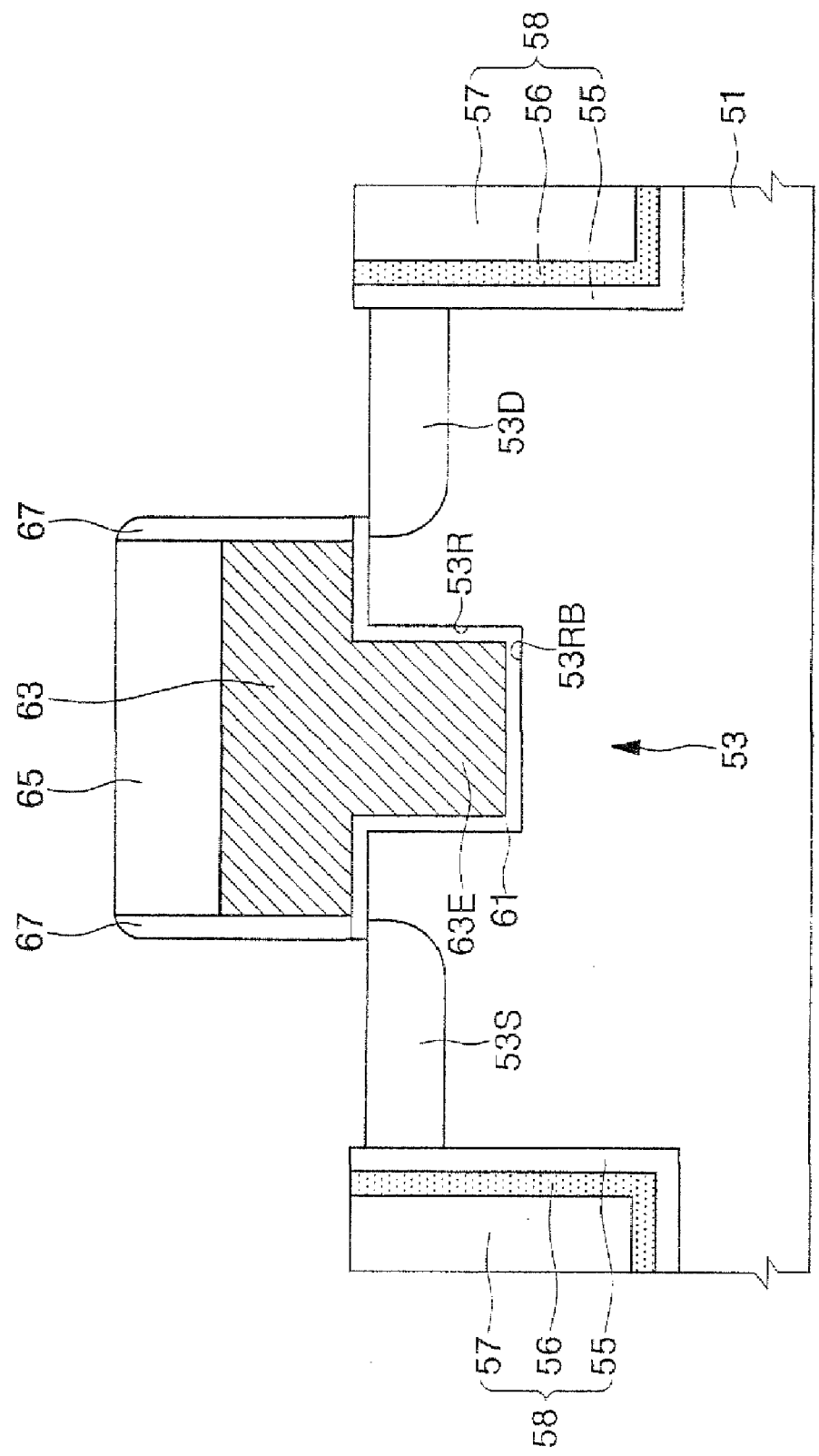

METHOD OF FABRICATING SEMICONDUCTOR DEVICES HAVING A RECESSED ACTIVE EDGE

This application claims the benefit of Korean Patent Application No. 2005-71915, filed Aug. 5, 2005, the contents of which are hereby incorporated by reference in their entirety.

BACKGROUND

1. Field of the Invention

The present invention relates to semiconductor devices and methods of fabricating the same, and more particularly, to semiconductor devices having a recessed active edge and methods of fabricating the same.

2. Description of Related Art

Owing to the increased demand for highly integrated semiconductor devices, laborious research into minimizing the 2-dimensional sizes of components such as transistors has progressed. When a transistor is downscaled, the channel length and channel width also decrease. Because the driving current of the transistor is inversely proportional to the channel length and proportional to the channel width, a reduction in channel length can lead to a rise in driving current and an increase in the response speed. However, the reduction in the channel length may cause some problems, such as the occurrence of punch-through, which leads to a reduction in the driving current. For this reason, the channel width should be designed while considering the driving current required for operation of the semiconductor device.

FIG. 1 shows the layout of a conventional MOS transistor.

Referring to FIG. 1, the conventional MOS transistor includes an isolation layer 11 disposed in a predetermined region of a semiconductor substrate (not shown) to define an active region 13, 14, and 15. The active region 13, 14, and 15 includes a channel region 14, a source region 13, and a drain region 15. A gate electrode 17 is disposed to cross over the active region 13, 14, and 15. The channel region 14 is disposed under the gate electrode 17. Also, the channel region 14 has a channel length L1 and a channel width W1. The source region 13 is disposed on one side of the channel region 14, and the drain region 15 is disposed on the other side of the channel region 14. Source contact plugs 23, 24, and 25 are disposed on the source region 13, and drain contact plugs 26, 27, and 28 are disposed on the drain region 15. The source contact plugs 23, 24, and 25 are connected to a source interconnection (not shown), and the drain contact plugs 26, 27, and 28 are connected to a drain interconnection (not shown). When the MOS transistor includes a plurality of source contact plugs and a plurality of drain contact plugs, like the source drain contact plugs 23, 24, and 25 and the drain contact plugs 26, 27, and 28, contact resistance can be reduced.

For ease of illustration, the operation of the MOS transistor will hereinafter be described on the assumption that the MOS transistor is a PMOSFET. In this case, each of the source region 13 and the drain region 15 may be a P-type high-concentration impurity region, and the channel region 14 may be an N-type impurity region.

When an operating voltage equal to or higher than a threshold voltage is applied to the gate electrode 17 and a potential difference is generated between the source region 13 and the drain region 15, electron-hole pairs (EHPs) are generated by impact ionization in the channel region 14 near the drain region 15. Also, due to a field crowding effect, the impact ionization is accelerated on both edges of the channel region 14 under the gate electrode 17. In this case, the generated holes are transported to the drain region 15 due to the potential difference between the source region 13 and the drain region 15. On the other hand, some of the electrons generated by the impact ionization are trapped in the isolation layer 11. That is, electron traps 18 and 19 are formed in the isolation layer 11 near both edges of the channel region 14, respectively. When electrons trapped in the electron traps 18 and 19 increase, holes may accumulate at both edges of the channel region 14. These accumulated holes may function as extending regions 21 and 22 of the drain region 15. As a result, the extended drain regions 21 and 22 may reduce the effective channel length L1' of the channel region 14. Consequently, both edges of the channel region 14 may become more susceptible to hot electron induced punch-through (HEIP).

In order to improve the foregoing problems, a method of extending the effective channel length by forming a protrusion on a gate electrode is provided.

FIG. 2 shows the layout of a conventional MOS transistor having a gate electrode protrusion.

Referring to FIG. 2, the conventional MOS transistor having a gate electrode protrusion includes an isolation layer 11 disposed in a predetermined region of a semiconductor substrate (not shown) to define an active region 13, 14, and 15. The active region 13, 14, and 15 includes a channel region 14, a source region 13, and a drain region 15. A gate electrode 37 is disposed to cross over the active region 13, 14, and 15. The gate electrode 37 includes protrusions 37T. The protrusions 37T of the gate electrode 37 are disposed on edges of the channel region 14. Source contact plugs 33 and 34 are disposed on the source region 13, and drain contact plugs 38 and 39 are disposed on the drain region 15. The source contact plugs 33 and 34 are connected to a source interconnection (not shown), and the drain contact plugs 38 and 39 are connected to a drain interconnection (not shown).

Owing to the protrusions 37T of the gate electrode 37, extended channel regions are formed on the edges of the channel region 14. That is, the edges of the channel region 14 have an extended effective channel length L2. The extended effective channel length L2 is longer than an original channel length L1 formed at other portions of the channel region 14. Thus, the protrusions 37T of the gate electrode 37 may serve to suppress the occurrence of HEIP.

However, the protrusions 37T of the gate electrode 37 should be formed in consideration of an insulation space between the source contact plugs 33 and 34 and the drain contact plugs 38 and 39. For example, a minimum distance D1 between the protrusions 37T of the gate electrode 37 and the drain contact plug 38 should be more than the resolution limit in a photolithography process. In this case, the space in which the source contact plugs 33 and 34 and the drain contact plugs 38 and 39 can be disposed on the source region 13 and the drain region 15 is reduced. When reducing the size or numbers of the source contact plugs 33 and 34 and the drain contact plugs 38 and 39, contact resistance may increase. The increase in the contact resistance deteriorates the current drivability of the MOS transistor.

Furthermore, a plurality of gate electrodes 37 may be disposed parallel to each other on the semiconductor substrate. In this case, the protrusions 37T of the gate electrode 37 should be formed in consideration of electrical insulation from protrusions (not shown) of other adjacent gate electrodes 37. This formation consideration with regard to the protrusions may further prevent high integration of the MOS transistor.

In order to overcome some of these problems, new transistors have been disclosed by Ichikawa in U.S. Pat. No. 6,611,027 B2 entitled "Protection Transistor with Improved Edge Structure."

According to Ichikawa, new transistors having gate electrode protrusions may be provided. Nevertheless, it is necessary to develop improved transistors and methods of fabricating the same, which can extend an effective channel length on an edge of an active region.

SUMMARY

Embodiments of the invention provide a semiconductor device having a recessed active edge and methods of fabricating the same. Some of the embodiments are directed to a semiconductor device that has an extended effective channel length on an edge of an active region that allows for high integration and a method of fabricating the same.

According to one exemplary embodiment, a semiconductor device includes a substrate and an isolation layer disposed in the substrate to define an active region. A gate electrode is disposed to cross over the active region. A source region and a drain region are disposed in the active region on both sides of the gate electrode. A recessed region is disposed under the gate electrode and on an edge of the active region adjacent to the isolation layer. A gate extension is disposed in the recessed region and contacts the gate electrode.

BRIEF DESCRIPTION OF THE DRAWINGS

The foregoing and other objects, features, and advantages of the invention will be apparent from the detailed description of exemplary embodiments of the invention, as illustrated in the accompanying drawings.

FIGS. 5A, 6A, and 7 are cross-sectional views taken along line I-I' of FIG. 3, illustrating a method of fabricating a transistor according to an exemplary embodiment of the present invention.

DETAILED DESCRIPTION

Figure 1:
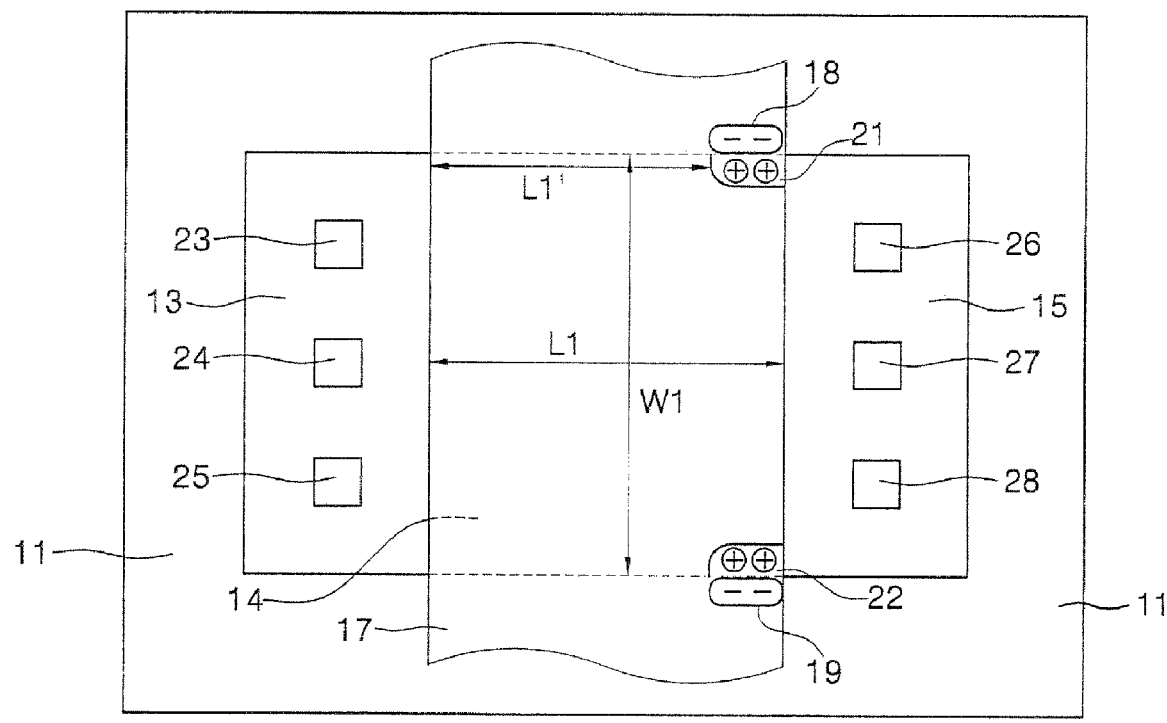
FIG. 1 shows the layout of a conventional MOS transistor.
Figure 2:
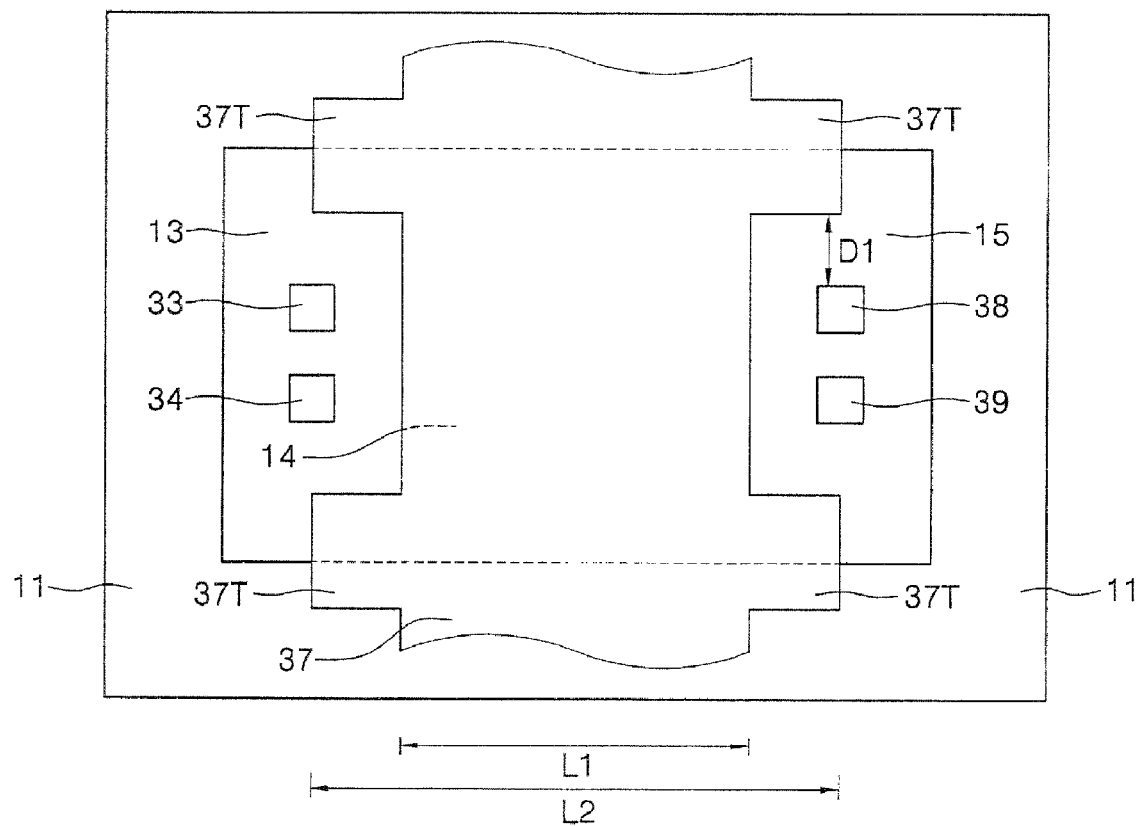
FIG. 2 shows the layout of a conventional MOS transistor having a gate electrode protrusion.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art. In the drawings, the thicknesses of layers and regions are exaggerated for clarity and may not be to scale. It will also be understood that when a layer is referred to as being "on" another layer or substrate, it can be directly on the other layer or substrate or intervening layers may also be present. The same reference numerals are used to denote the same elements.

Figure 3:
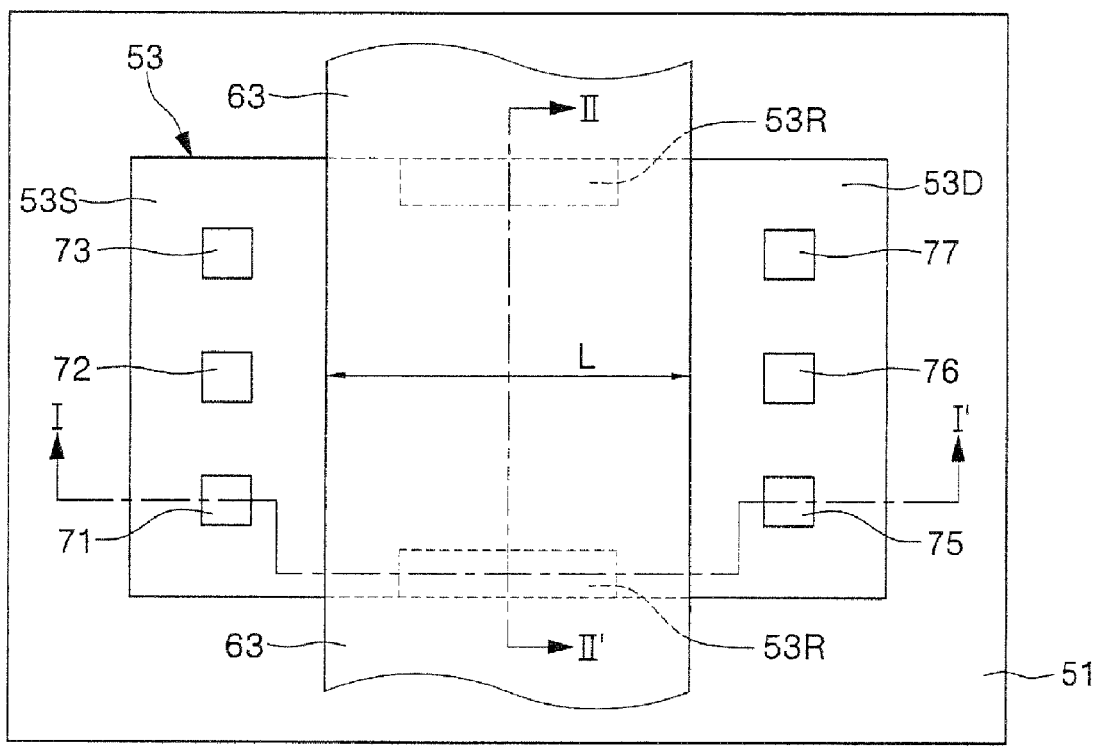
FIG. 3 shows the layout of a transistor having a recessed active edge according to an exemplary embodiment of the present invention.
Figure 4A:
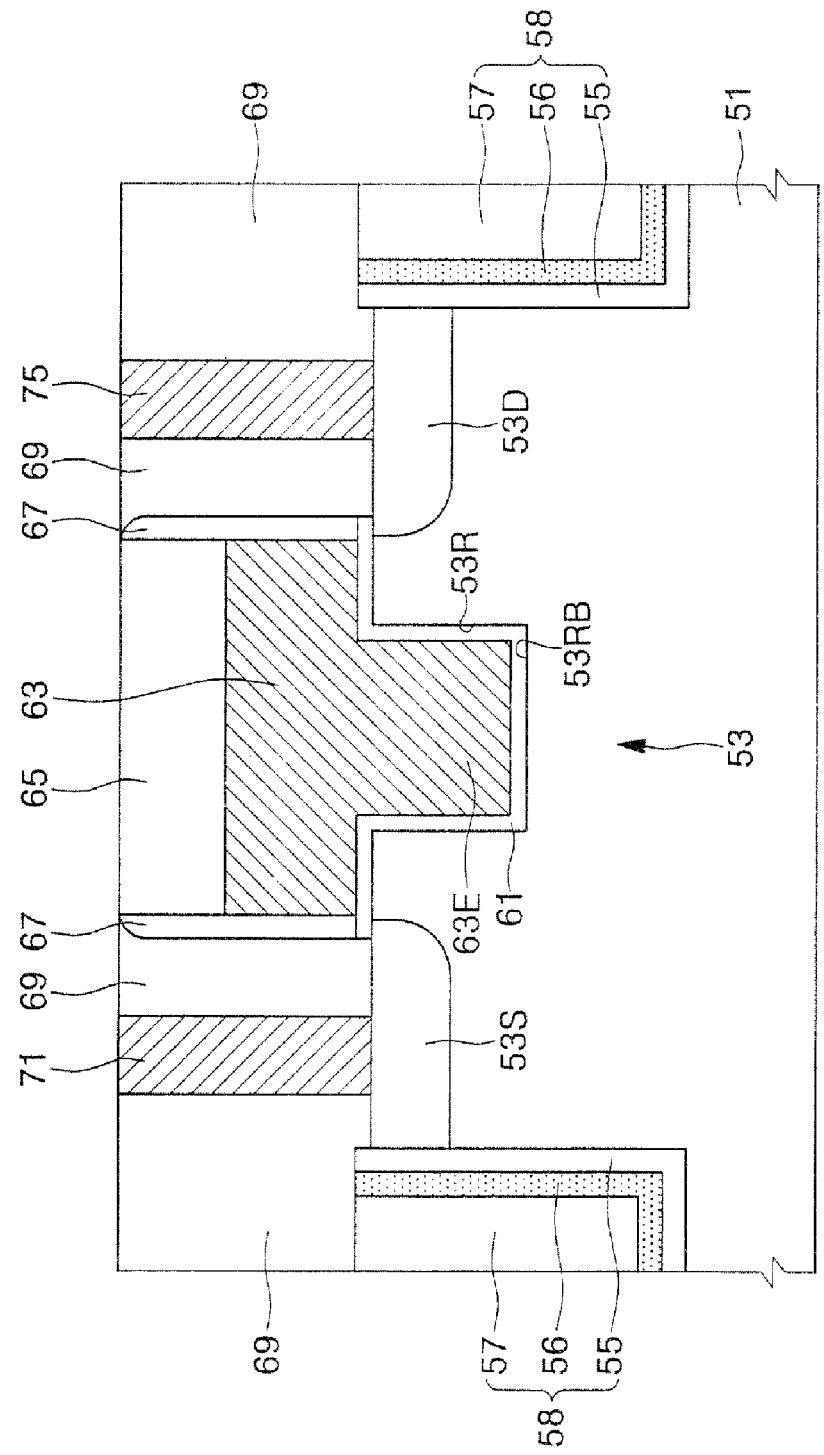
FIG. 4A is a cross-sectional view taken along line I-I' of FIG. 3.
Figure 4B:
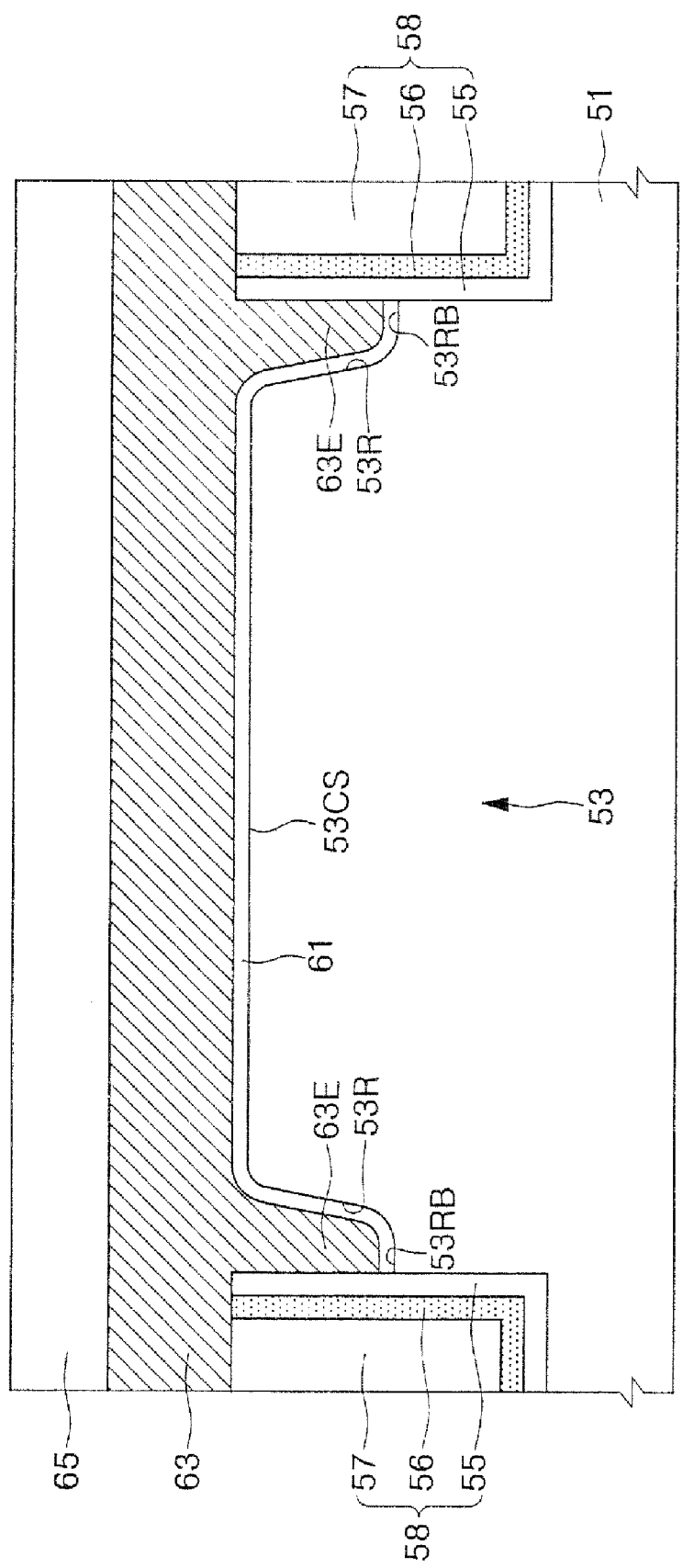
FIG. 4B is a cross-sectional view taken along line II-II' of FIG. 3.
Figure 5A:
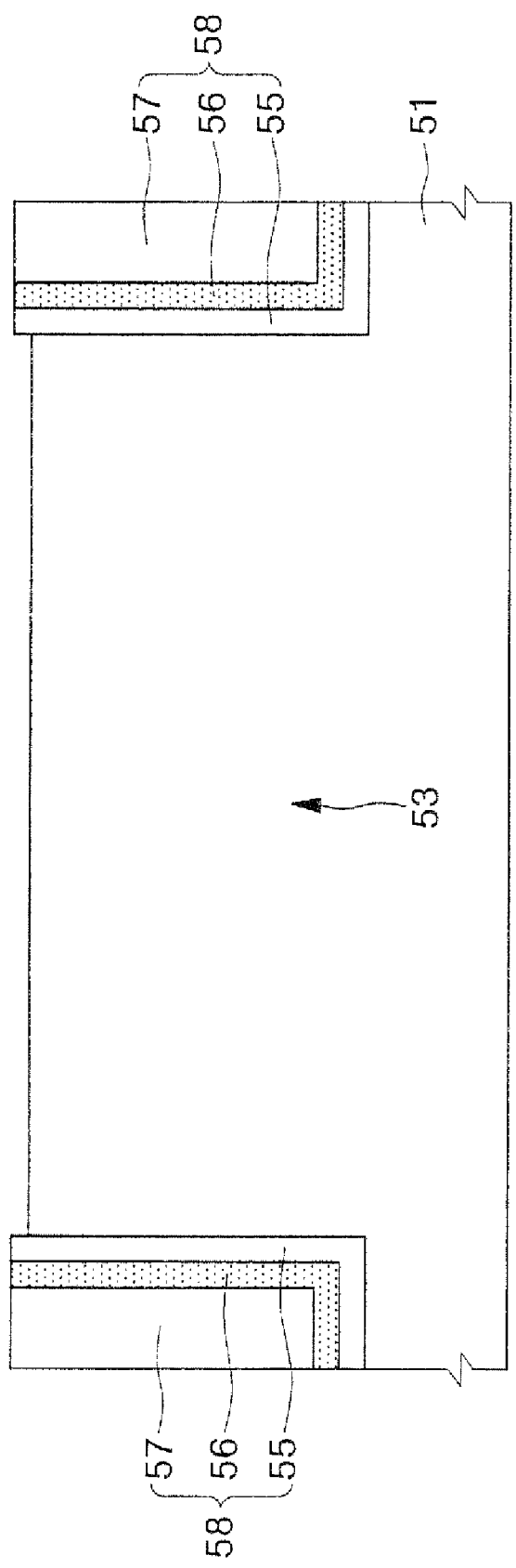
Figure 5B:
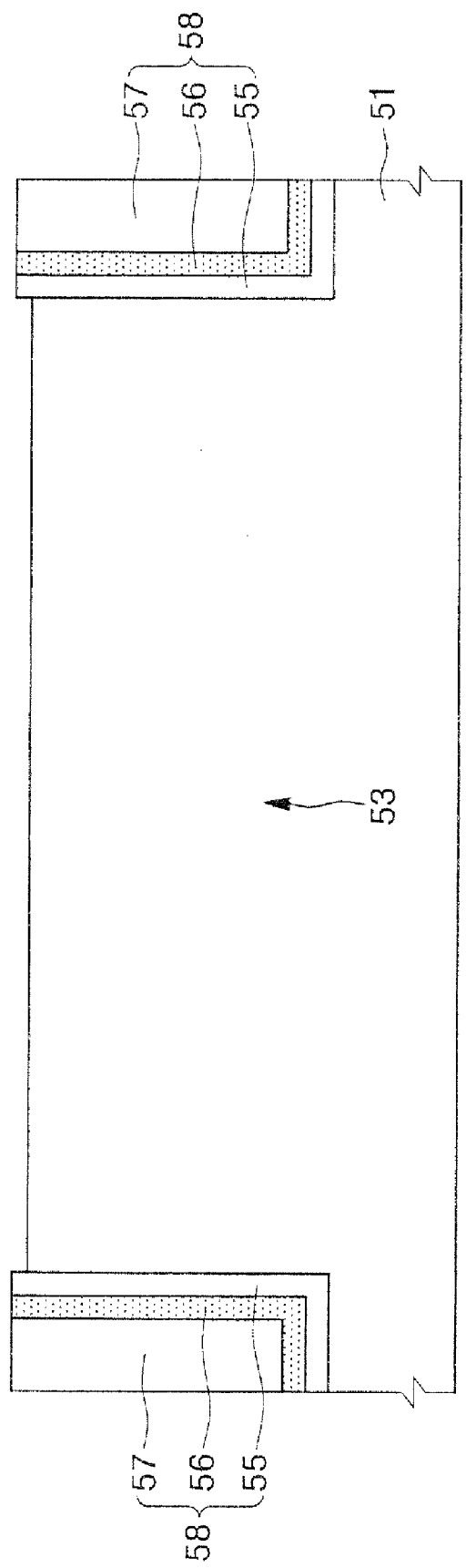
FIGS. 5B and 6B are cross-sectional views taken along line II-II' of FIG. 3, illustrating the method of fabricating the transistor according to the exemplary embodiment of the present invention.
Figure 6B:
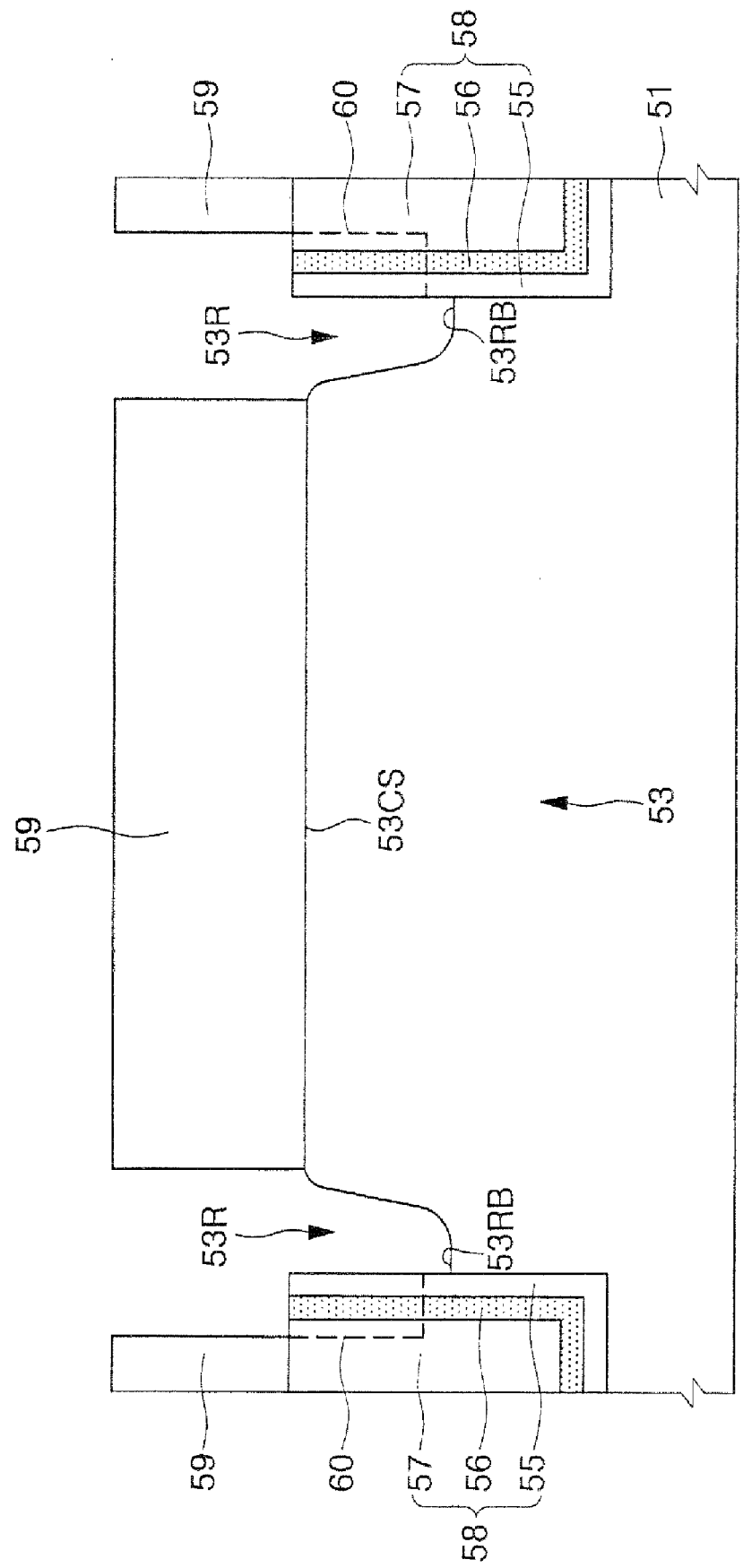
Figure 8:
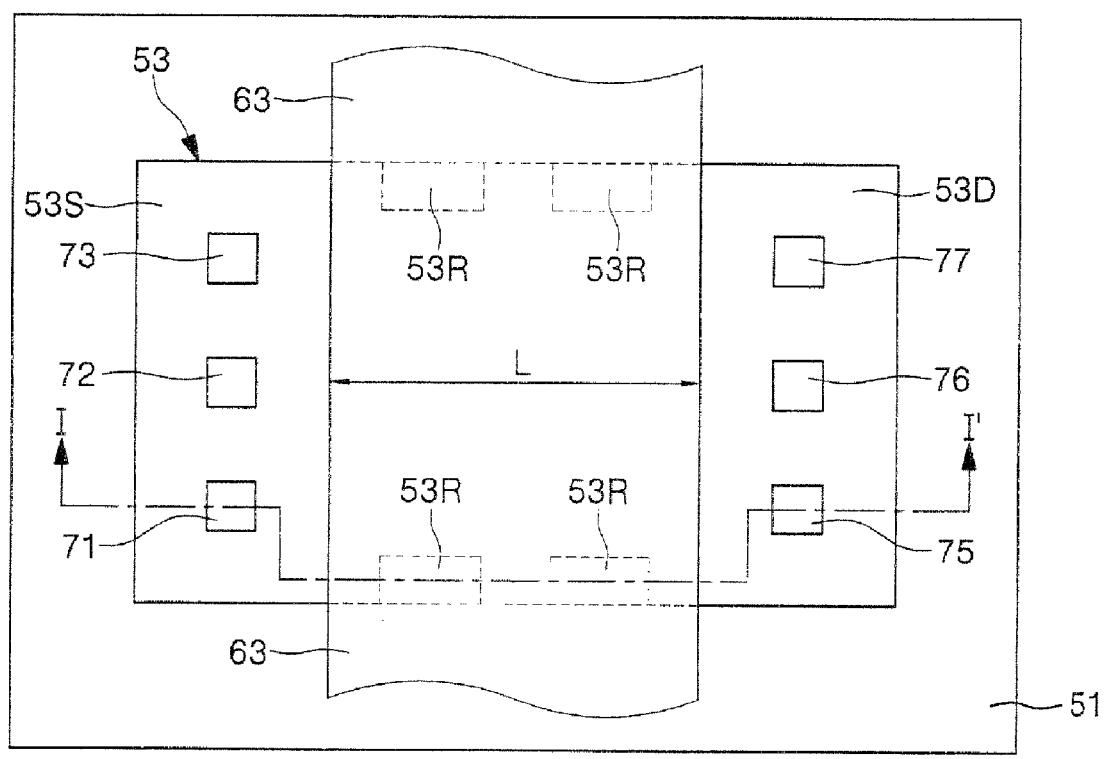
FIG. 8 shows the layout of a transistor having a recessed active edge according to another exemplary embodiment of the present invention.
Figure 9:
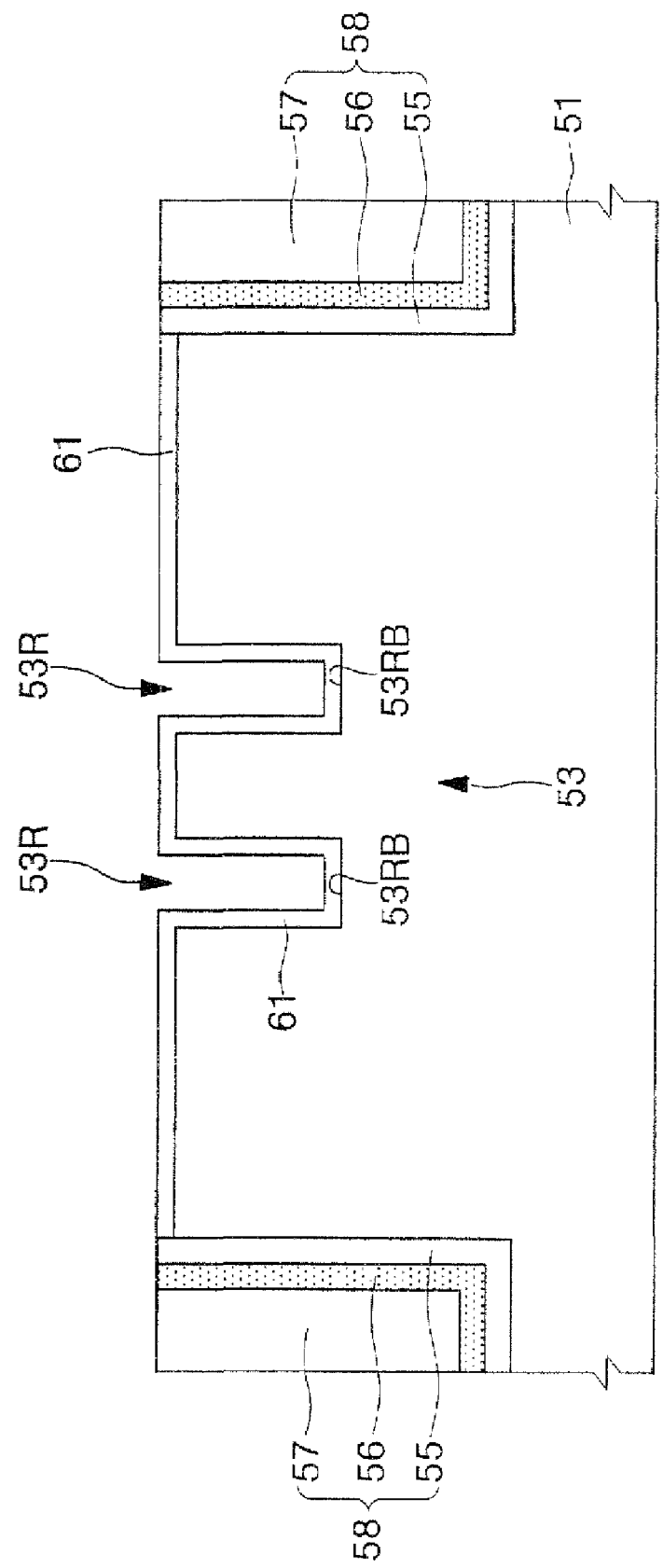
FIGS. 9 and 10 are cross-sectional views taken along line I-I' of FIG. 8, illustrating a method of fabricating a transistor according to another exemplary embodiment of the present invention.
Figure 10:
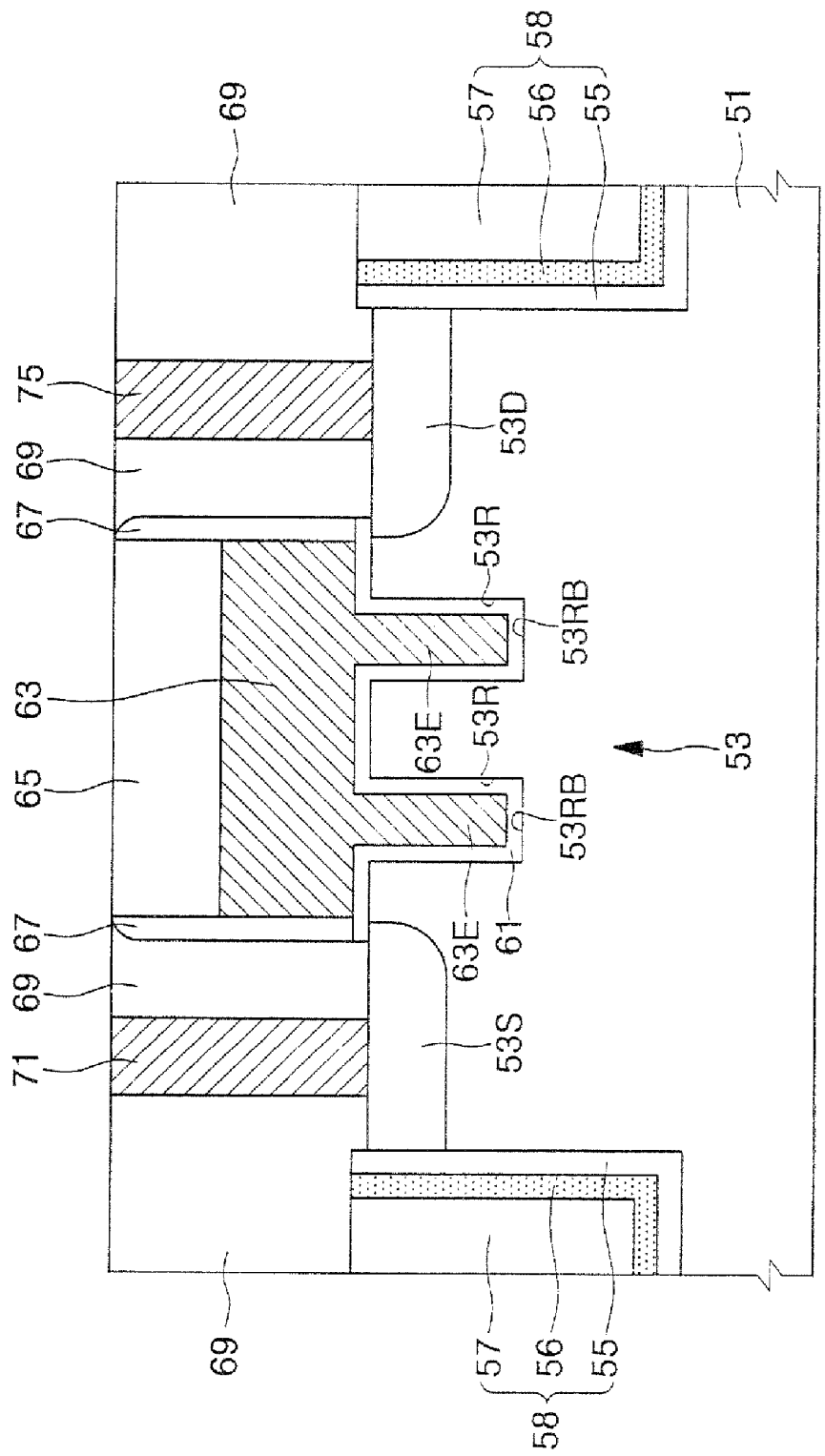
Figure 11:
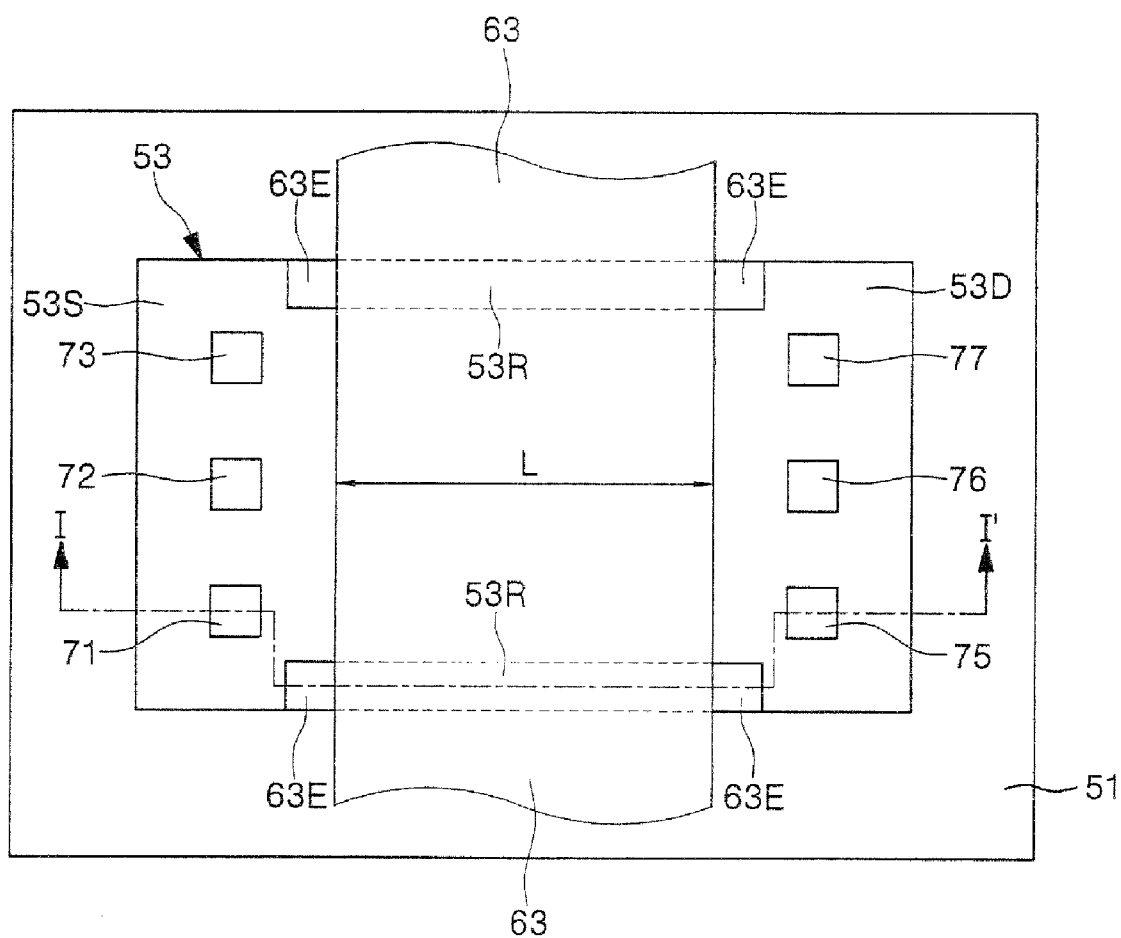
FIG. 11 shows the layout of a transistor having a recessed active edge according to still another exemplary embodiment of the present invention.
Figure 12:
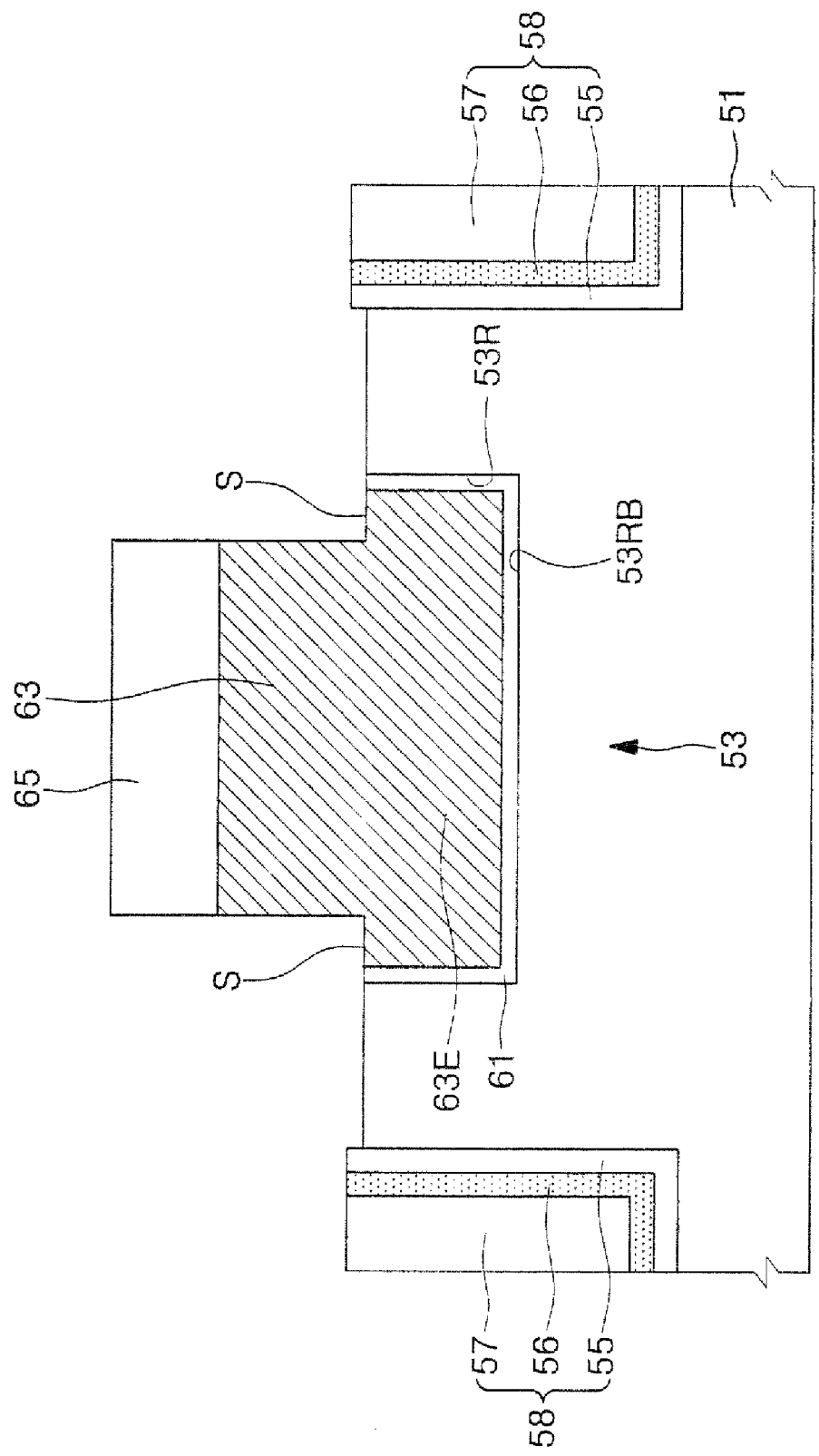
FIGS. 12 and 13 are cross-sectional views taken along line I-I' of FIG. 11, illustrating a method of fabricating a transistor according to still another exemplary embodiment of the present invention.
Figure 13:
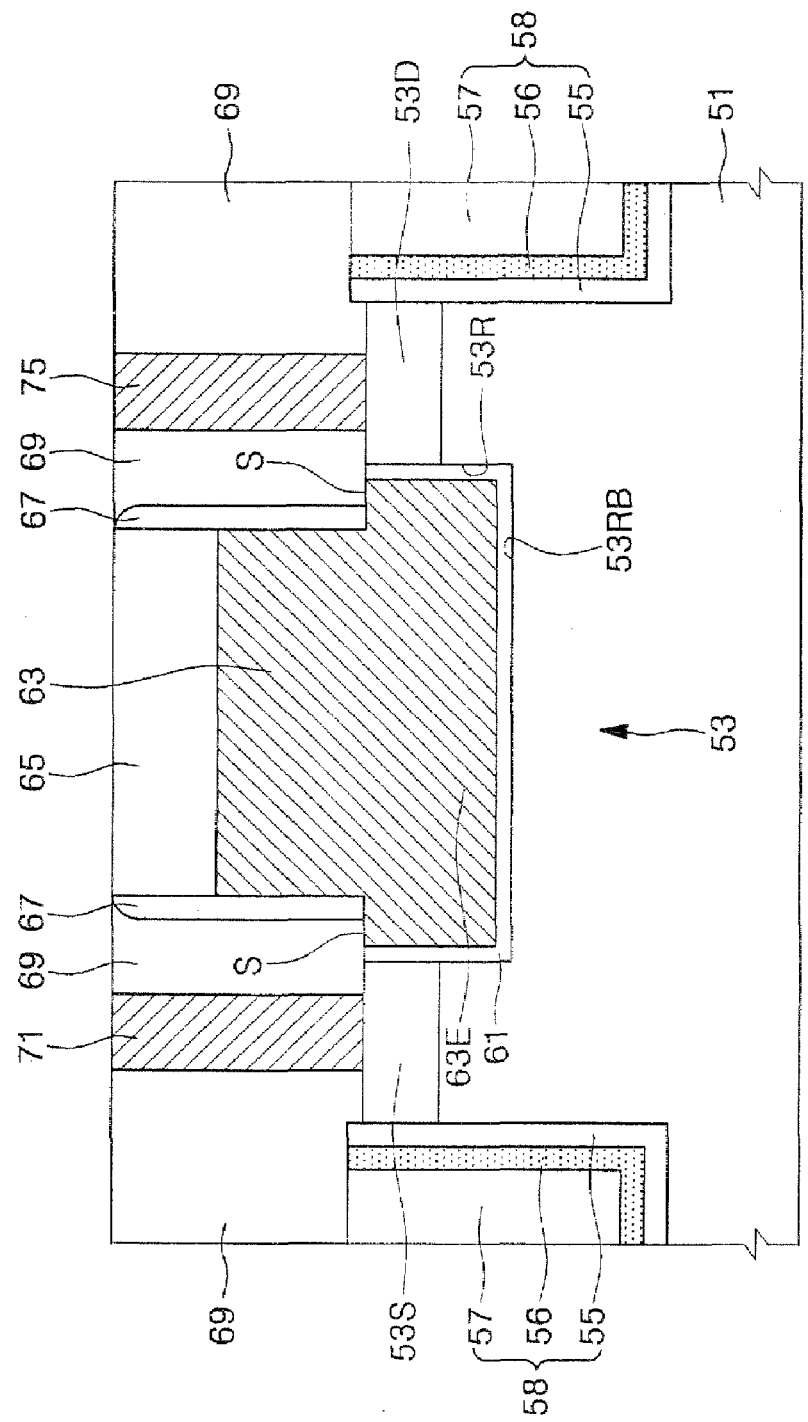

FIG. 3 shows the layout of a transistor having a recessed active edge according to an exemplary embodiment of the present invention, FIG. 4A is a cross-sectional view taken along line I-I' of FIG. 3, FIG. 4B is a cross-sectional view taken along line II-II' of FIG. 3, FIGS. 5A, 6A, and 7 are cross-sectional views taken along line I-I' of FIG. 3, illustrating a method of fabricating a transistor according to an exemplary embodiment of the present invention, and FIGS. 5B and 6B are cross-sectional views taken along line II-II' of FIG. 3, illustrating the method of fabricating the transistor according to the exemplary embodiment of the present invention. FIG. 8 shows the layout of a transistor having a recessed active edge according to another exemplary embodiment of the present invention, and FIGS. 9 and 10 are cross-sectional views taken along line I-I' of FIG. 8, illustrating a method of fabricating a transistor according to another exemplary embodiment of the present invention. Also, FIG. 11 shows the layout of a transistor having a recessed active edge according to still another exemplary embodiment of the present invention, and FIGS. 12 and 13 are cross-sectional views taken along line I-I' of FIG. 11, illustrating a method of fabricating a transistor according to still another exemplary embodiment of the present invention.

First, a transistor having a recessed active edge according to an exemplary embodiment of the present invention will be described with reference to FIGS. 3, 4A, and 4B.

Referring to FIGS. 3, 4A, and 4B, the transistor according to an exemplary embodiment of the present invention includes a substrate 51 and an isolation layer 58. The isolation layer 58 is disposed in the substrate 51 to define an active region 53.

The substrate 51 may be a semiconductor substrate, such as a silicon wafer. The isolation layer 58 may include a sidewall oxide layer 55, a trench liner 56, and an insulating layer 57, which are sequentially stacked. In this case, the sidewall oxide layer 55 may be an oxide layer such as a silicon oxide layer. The trench liner 56 may be a nitride layer, such as a silicon nitride (SiN) layer or a silicon oxynitride (SiON) layer. The insulating layer 57 may be an oxide layer, such as a high-density plasma (HDP) oxide layer.

A gate electrode 63 is disposed to cross over the active region 53. The gate electrode 63 may extend to cross over both the active region 53 and the isolation layer 58. A hard mask pattern 65 may be disposed on the gate electrode 63. Insulating spacers 67 may be disposed on sidewalls of the hard mask pattern 65 and the gate electrode 63. A gate dielectric layer 61 may be interposed between the gate electrode 63 and the active region 53. The gate electrode 63 may be formed of a conductive material layer, such as a polysilicon layer. The hard mask pattern 65 may be a nitride layer, such as a silicon nitride layer or a silicon oxynitride layer. The insulating spacers 67 may be formed of a silicon oxide layer, a silicon nitride layer, a silicon oxynitride layer, or a combination thereof. The gate dielectric layer 61 may be a silicon oxide layer or a high-k dielectric layer.

A source region 53S is disposed in the active region 53 on one side of the gate electrode 63. A drain region 53D is disposed in the active region 53 on the other side of the gate electrode 63. A channel region may be defined in the active region 53 between the source region 53S and the drain region 53D. That is, the channel region may be defined under the gate electrode 63. The source region 53S and the drain region 53D may be impurity regions of the same conductivity type. The channel region may be an impurity region of a conductivity type opposite to that of the source and drain regions 53S and 53D. For example, the source and drain regions 53S and 53D may be P-type impurity regions, and the channel region may be an N-type impurity region. Also, the source region 53S and the drain region 53D may exchange positions. That is, the drain region 53D may be disposed in the active region 53 on one side of the gate electrode 63, and the source region 53S may be disposed in the active region 53 on the other side of the gate electrode 63.

At least one recessed region 53R is provided on an edge of the active region 53. Also, a pair of recessed regions, i.e., first and second recessed regions 53R, may be disposed on both edges of the active region 53. The recessed region 53R is disposed under the gate electrode 63 and on the edge of the active region 53 adjacent to the isolation layer 58. For example, as shown in FIG. 3, each of the recessed regions 53R may be disposed on both edges of the active region 53 facing each other. That is, one recessed region 53R may be disposed on one edge of the active region 53, and another recessed region 53R may be disposed on the other edge of the active region 53. The recessed region 53R may be smaller than the gate electrode 63. That is, the recessed region 53R may be completely covered by the gate electrode 63. A bottom 53RB of the recessed region 53R may be disposed at a lower level than bottoms of the source and drain regions 53S and 53D. Also, as shown in FIG. 4B, the bottom 53RB of the recessed region 53R may be sloped down toward the isolation layer 58. Further, the bottom 53RB of the recessed region 53R may be disposed at a lower level than a central top surface 53CS of the active region 53. The gate electrode 63 extends to fill the recessed region 53R. That is, a gate extension 63E is provided in the recessed region 53R. The gate extension 63E is in contact with the gate electrode 63. The gate dielectric layer 61 may also be interposed between the gate extension 63E and the active region 53.

The substrate 51 having the gate electrode 63, the source region 53S, and the drain region 53D may be covered with an interlevel dielectric layer (ILD) 69. The interlevel dielectric layer 69 may be a silicon oxide layer. Source contact plugs 71, 72, and 73 may be disposed on the source region 53S through the interlevel dielectric layer 69. Drain contact plugs 75, 76, and 77 may be disposed on the drain region 53D through the interlevel dielectric layer 69. The source contact plugs 71, 72, and 73 may be connected to a source interconnection (not shown), and the drain contact plugs 75, 76, and 77 may be connected to a drain interconnection (not shown).

When an operating voltage equal to or higher than a threshold voltage is applied to the gate electrode 63 and a potential difference is generated between the source region 53S and the drain region 53D, electron-hole pairs (EHPs) may be generated due to impact ionization in the active region 53 near the drain region 53D. For example, when the transistor is a PMOSFET, holes generated by the impact ionization are transported to the drain region 53D due to the potential difference between the source and drain regions 53S and 53D. On the other hand, some of electrons generated by the impact ionization are trapped in the isolation layer 58. That is, electron traps are formed in the isolation layer 58 near both edges of the active region 53, respectively. As the electrons trapped in the electron traps increase, holes are accumulated in both edges of the active region 53. The holes serve to expand the drain region 53D. Thus, the effective channel length may be reduced on both edges of the active region 53.

In some embodiments of the present invention, the channel length may be determined by the gate electrode 63 and the gate extension 63E. Here, a central channel length of the gate electrode 53 may be substantially equal to the width "L" of the gate electrode 63. However, according to the exemplary embodiment of the present invention, the recessed region 53R is provided on the edge of the active region 53. The gate extension 63E is disposed in the recessed region 53R. The recessed region 53R and the gate extension 63E serve to extend the channel length on the edge of the active region 53. That is, the channel length of the edge of the active region 53 is longer than the channel length "L" of the other portion of the active region 53. Thus, even if holes are accumulated in both edges of the active region 53, the effective channel length of the edge of the active region 53 may be longer than that of the other portion thereof. As a result, the recessed region 53R and the gate extension 63E, which are disposed on the edge of the active region 53, may serve to prevent the occurrence of hot electron induced punch-through (HEIP).

According to the exemplary embodiment of the present invention described above, the recessed region 53R may be disposed under the gate electrode 63. That is, the recessed region 53R does not occupy an additional space when viewed in a plan view. Thus, it is possible to secure sufficient space for arranging the source contact plugs 71, 72, and 73 and the drain contact plugs 75, 76, and 77. Further, a plurality of gate electrodes 63 may be disposed on the substrate 51. In this case, the recessed region 53R does not impede the arrangement of adjacent gate electrodes 63. Consequently, the MOS transistor according to the exemplary embodiment of the present invention is advantageous in integration density over the conventional MOS transistor having a gate electrode protrusion.

Hereinafter, a transistor having a recessed active edge according to another exemplary embodiment of the present invention will be described with reference to FIGS. 8 and 10.

Referring to FIGS. 8 and 10, in the transistor according to another exemplary embodiment of the present invention, two recessed regions 53R are disposed on each of the edges of an active region 53. The recessed regions 53R are disposed under a gate electrode 63 and on the edge of the active region 53 adjacent to an isolation layer 58. That is, two recessed regions 53R may be disposed on one edge of the active region 53, and another two recessed regions 53R may be disposed on the other edge of the active region 53 as shown in FIG. 8. In other embodiments, three or more recessed regions 53R may be disposed on each of the edges of the active region 53.

Bottoms 53RB of the recessed regions 53R may be disposed at a lower level than bottoms of a source region 53S and a drain region 53D. Also, the bottom 53RB of the recessed region 53R may be sloped down toward the isolation layer 58. Further, the bottom 53RB of the recessed region 53R may be disposed at a lower level than a central top surface of the active region 53. The gate electrode 63 extends to fill the recessed regions 53R. That is, gate extensions 63E are provided in each of the recessed regions 53R. The gate extensions 63E are in contact with the gate electrode 63.

According to this exemplary embodiment of the present invention, the recessed regions 53R are disposed on each of the edges of the active region 53. The recessed regions 53R and the gate extensions 63E serve to extend the channel length of the edge of the active region 53. That is, the channel length of the edge of the active region 53 is longer than a channel length "L" of the other portion of the active region 53. Thus, even if holes are accumulated on both edges of the active region 53, the effective channel length of the edge of the active region 53 may be longer than that of the other portion thereof. As a result, the recessed regions 53R disposed on both edges of the active region 53 can serve to prevent the occurrence of HEIP.

The recessed regions 53R may also be disposed under the gate electrode 63. That is, the recessed regions 53R do not occupy an additional space when viewed in a plan view. Thus, it is possible to secure sufficient space for arranging source contact plugs 71, 72, and 73 and drain contact plugs 75, 76, and 77. That is, the MOS transistor according to this exemplary embodiment of the present invention is advantageous in integration density over the conventional MOS transistor having a gate electrode protrusion.

Hereinafter, a transistor having a recessed active edge according to still another exemplary embodiment of the present invention will be described with reference to FIGS. 11 and 13.

Referring to FIGS. 11 and 13, in the transistor according to still another exemplary embodiment of the present invention, at least one recessed region 53R is disposed on both edges of an active region 53, respectively. The recessed region 53R is disposed under a gate electrode 63 and on the edge of the active region 53 adjacent to an isolation layer 58. That is, at least one recessed region 53R may be disposed on one edge of the active region 53, and at least one recessed region 53R may be disposed on the other edge of the active region 53. The gate electrode 63 may cover a portion of the recessed region 53R. Also, the recessed region 53R may extend on both sides of the gate electrode 63 when viewed in a plan view. That is, the recessed region 53R may have a larger width than a width "L" of the gate electrode 63 in a widthwise direction of the gate electrode 63.

A bottom 53RB of the recessed region 53R may be disposed at a lower level than bottoms of a source region 53S and a drain region 53D. Also, the bottom 53RB of the recessed region 53R may be sloped down toward the isolation layer 58. Further, the bottom 53RB of the recessed region 53R may be disposed at a lower level than a central top surface of the active region 53. The gate electrode 63 extends to fill the recessed region 53R. That is, a gate extension 63E is disposed in the recessed region 53R. The gate extension 63E may include a portion that extends from at least one sidewall of the gate electrode 63 in a direction parallel to the widthwise direction of the gate electrode 63. The gate extension 63E is in contact with the gate electrode 63.

In this case, a top surface "S" of the gate extension 63E may be disposed at a lower level than or substantially the same level as top surfaces of the source and drain regions 53S and 53D.

Meanwhile, the recessed region 53R may extend on at least one side of the gate electrode 63 when viewed in a plan view. A gate extension 63F may be disposed in the recessed region 53R. Further, the recessed region 53R may include portions that extend from both sidewalls of the gate electrode 63 toward the source and drain regions 53S and 53D.

According to this exemplary embodiment of the present invention, the recessed regions 53R and the gate extension 63E serve to extend the channel length on the edge of the active region 53. That is, the channel length of the edge of the active region 53 is longer than a channel length "L" of the other portion of the active region 53. Thus, even if holes are accumulated on both edges of the active region 53, the effective channel length of the edge of the active region 53 may be longer than that of the other portion of the active region 53. As a result, the recessed regions 53R disposed on both edges of the active region 53 can serve to prevent the occurrence of HEIP.

Also, the recessed regions 53R may extend on at least one side of the gate electrode 63. In addition, as mentioned above, the top surface "S" of the gate extension 63F may be disposed at a lower level than or substantially the same level as the top surfaces of the source and drain regions 53S and 53D. Thus, the influence of the recessed regions 53R on the arrangement of source contact plugs 71, 72, and 73 and drain contact plugs 75, 76, and 77 can be minimized. Also, a plurality of gate electrodes 63 may be disposed on the substrate 51. Similarly, the influence of the recessed regions 53R on the arrangements of adjacent gate electrodes 63 can be minimized.

Hereinafter, methods of fabricating a transistor having a recessed active edge according to an exemplary embodiment of the present invention will be described with reference to FIGS. 3 through 7.

Referring to FIGS. 3, 5A, and 5B, the methods of fabricating a transistor according to an exemplary embodiment of the present invention include forming an isolation layer 58 in a substrate 51 to define an active region 53.

The substrate 51 may be a semiconductor substrate, such as a silicon wafer. The isolation layer 58 may be formed using, for example, a known shallow trench isolation (STI) technique. In this case, a trench may be formed in the substrate 51 to define the active region 53, and a sidewall oxide layer 55, a trench liner 56, and an insulating layer 57 may be sequentially stacked in the trench. The sidewall oxide layer 55 may be formed of silicon oxide using a thermal oxidation process. The trench liner 56 may be formed of nitride, such as silicon nitride or silicon oxynitride. The insulating layer 57 may be formed of oxide, such as HDP oxide.

Channel ions may be implanted into the active region 53 to a predetermined depth using the isolation layer 58 as an ion implantation mask. The channel ions may be N-type or P-type impurity ions. The depth to which the channel ions are implanted may be shallower than the depth of the bottom of the isolation layer 58.

Referring to FIGS. 3, 6A, and 6B, a recessed region 53R is formed on an edge of the active region 53.

Specifically, the recessed region 53R may be formed by selectively removing the edge of the active region 53 adjacent to the isolation layer 58. Initially, a mask pattern 59 may be formed on the active region 53 and the isolation layer 58. The mask pattern 59 may be formed by a known photolithography, pullback, or spacer process. The mask pattern 59 may include an opening that exposes the edge of the active region 53. Here, when the mask pattern 59 is formed by the pullback process or the spacer process, the opening may be formed to a smaller size than the resolution limit in a photolithography process. The edge of the active region 53 may be selectively removed using the mask pattern 59 as an etch mask. During the selective removal of the edge of the active region 53, a portion 60 of the isolation layer 58 may be etched along with the substrate in the active region 53. However, the etching of the portion 60 of the isolation layer 58 can be minimized by etching the edge of the active region 53 under etching conditions having an etch selectivity with respect to the isolation layer 58. In another method, during the selective removal of the edge of the active region 53, the portion 60 of the isolation layer 58 may be etched together with the active region 53. In this case, the recessed region 53R may extend from the edge of the active region 53 into the isolation layer 58.

The recessed region 53R may be formed on each of the edges of the active region 53 facing each other. In this case, one recessed region 53R may be formed on one edge of the active region 53, and another recessed region 53R may be formed on the other edge of the active region 53. A bottom 53RB of the recessed region 53R may be sloped down toward the isolation layer 58. Further, the bottom 53RB of the recessed region 53R may be disposed at a lower level than a central top surface 53CS of the active region 53.

Thereafter, the mask pattern 59 may be removed to expose the active region 53 having the recessed region 53R.

Referring to FIGS. 3 and 7, a gate dielectric layer 61 is formed on the active region 53 having the recessed region 53R. That is, the gate dielectric layer 61 is formed on an inner wall of the recessed region 53R and a surface of the active region 53. The gate dielectric layer 61 uniformly covers not only the bottom 53RB of the recessed region 53R but also the surface of the active region 53. The gate dielectric layer 61 may be formed by a thermal oxidation process, a chemical vapor deposition (CVD) process, or an atomic layer deposition (ALD) process. The gate dielectric layer 61 may be formed of a silicon oxide layer or a high-k dielectric layer.

A gate electrode 63 is formed on the substrate 51 having the recessed region 53R and the gate dielectric layer 61.

Specifically, a conductive material layer and a hard mask layer may be sequentially formed on the substrate 51 having the recessed region 53R and the gate dielectric layer 61. The conductive material layer may be formed of a polysilicon layer, a metal layer, a metal silicide layer, or a combination thereof. The conductive material layer may be formed to fill the recessed region 53R and cover the entire surface of the substrate 51. The hard mask layer may be formed of an insulating layer having an etch selectivity with respect to the conductive material layer. For example, the hard mask layer may be formed of silicon nitride or silicon oxynitride. The hard mask layer and the conductive material layer may be sequentially patterned, thereby forming a hard mask pattern 65 and the gate electrode 63. The gate electrode 63 may be formed to cross over the active region 53 and cover the recessed region 53R. During the formation of the gate electrode 63, the recessed region 53R may be filled with the conductive material layer. In this case, a gate extension 63E may be formed in the recessed region 53R. The gate extension 63E is in contact with the gate electrode 63.

As shown in FIGS. 3 and 7, the recessed region 53R may be formed to a smaller size than the gate electrode 63. That is, the gate electrode 63 may be formed to completely cover the recessed region 53R.

Insulating spacers 67 may be formed on sidewalls of the gate electrode 63 and the hard mask pattern 65. The insulating spacers 67 may be formed using a silicon oxide layer, a silicon nitride layer, a silicon oxynitride layer, or a combination thereof. However, the formation of the insulating spacers 67 may be omitted.

A source region 53S and a drain region 53D are formed on the substrate 51 having the gate electrode 63. Specifically, impurity ions may be implanted into the active region 53 using the hard mask pattern 65 and the gate electrode 63 as ion implantation masks. The implantation of the impurity ions may be performed using various angles and ion implantation energies. As a result, the source region 53S may be formed in the active region 53 on one side of the gate electrode 63. Also, the drain region 53D may be formed in the active region 53 on the other side of the gate electrode 63. Thus, a channel region is defined in the active region 53 between the source region 53S and the drain region 53D. The source and drain regions 53S and 53D may be formed by implanting impurity ions of the same conductivity type. The source and drain regions 53S and 53D may be formed by implanting N-type or P-type impurity ions. Also, the source and drain regions 53S and 53D may be formed by implanting impurity ions of an opposite conductivity type to that of the channel region. For example, when the channel region is doped with N-type impurity ions, the source and drain regions 53S and 53D may be doped with P-type impurity ions. The source and drain regions 53S and 53D may also be disposed at a higher level than the bottom 53RB of the recessed region 53R.

Referring again to FIGS. 3, 4A, and 4B, an interlevel dielectric layer 69 may be formed on the substrate 51 having the gate electrode 63, the source region 53S, and the drain region 53D. The interlevel dielectric layer 69 may be formed of a silicon oxide layer. Source contact plugs 71, 72, and 73 may be formed on the source region 53S through the interlevel dielectric layer 69. Drain contact plugs 75, 76, and 77 may be formed on the drain region 53D through the interlevel dielectric layer 69. The source contact plugs 71, 72, and 73 and the drain contact plugs 75, 76, and 77 may be formed of a polysilicon layer, a metal layer, a metal silicide layer, or a combination thereof.

According to this exemplary embodiment of the present invention, the recessed regions 53R may be formed under the gate electrode 63. That is, the recessed regions 53R do not occupy an additional space when viewed in a plan view. Thus, it is easier to ensure sufficient space for arranging the source contact plugs 71, 72, and 73 and the drain contact plugs 75, 76, and 77. Further, a plurality of gate electrodes 63 may be formed on the substrate 51. In this case, the recessed region 53R does not impede the formation of adjacent gate electrodes 63.

Hereinafter, methods of fabricating a transistor having a recessed active edge according to another exemplary embodiment of the present invention will be described with reference to FIGS. 8 through 10.

Referring to FIGS. 8 and 9, the methods of fabricating a transistor according to another exemplary embodiment of the present invention include forming an isolation layer 58 in a substrate 51 to define an active region 53. Hereinafter, only differences between the present exemplary embodiment and the previous exemplary embodiment described with reference to FIGS. 3 through 7 will be briefly described.

According to this exemplary embodiment of the present invention, two recessed regions 53R are formed on each of the edges of the active region 53. Specifically, the recessed regions 53R may be formed by selectively removing the edges of the active region 53. Initially, a mask pattern (not shown) may be formed on the active region 53 and the isolation layer 58. The mask pattern may be formed by a well-known photolithography, pullback, or spacer process. The mask pattern may include openings to expose the edges of the active region 53. Here, when the mask pattern is formed by the pullback process or the spacer process, each of the openings may be formed to a smaller size than the resolution limit in a photolithography process. The edges of the active regions 53 may be selectively removed using the mask pattern as an etch mask. During the selective removal of the edges of the active region 53, the isolation layer 58 may be etched. However, the etching of the isolation layer 58 may be minimized by etching the edges of the active region 53 under etching conditions having an etch selectivity with respect to the isolation layer 58. In another method, during the selective removal of the edges of the active region 53, the isolation layer 58 may be etched together with the edges of the active region 53. In this case, the recessed regions 53R may extend from the edge of the active region 53 into the isolation layer 58.

As a result, two recessed regions 53R may be formed on one edge of the active region 53, and other two recessed regions 53R may be formed on the other edge of the active region 53. In other cases, three or more recessed regions 53R may be formed on each edge of the active region 53. Bottoms 53RB of the recessed regions 53R may be sloped down toward the isolation layer 58. Further, the bottoms 53RB of the recessed regions 53R may be disposed at a lower level than a central top surface of the active region 53.

A gate dielectric layer 61 is formed on the active region 53 having the recessed regions 53R. The gate dielectric layer 61 may uniformly cover not only the bottoms 53RB of the recessed regions 53R but also an exposed surface of the active region 53.

Referring again to FIGS. 8 and 10, a gate electrode 63 is formed on the substrate 51 having the recessed regions 53R and the gate dielectric layer 61. The gate electrode 63 may be formed to cross over the active region 53 and cover the recessed regions 53R. During the formation of the gate electrode 63, the recessed regions 53R may be filled with a conductive material layer. In this case, gate extensions 63E may be formed in the recessed regions 53R. The gate extensions 63E may be in contact with the gate electrode 63. As shown in FIGS. 8 and 10, the recessed regions 53R may be formed to a smaller size than the gate electrode 63. That is, the gate electrode 63 may be formed to completely cover the recessed regions 53R.

Insulating spacers 67 may be formed on sidewalls of the gate electrode 63 and a hard mask pattern 65. However, the formation of the insulating spacers 67 may be omitted.

A source region 53S and a drain region 53D are formed on the substrate 51 having the gate electrode 63. The source and drain regions 53S and 53D may be disposed at a higher level than the bottoms 53RB of the recessed regions 53R.

An interlevel dielectric layer 69 may be formed on the substrate 51 having the gate electrode 63, the source region 53S, and the drain region 53D. Source contact plugs 71, 72, and 73 may be formed on the source region 53S through the interlevel dielectric layer 69. Drain contact plugs 75, 76, and 77 may be formed on the drain region 53D through the interlevel dielectric layer 69.

According to this exemplary embodiment of the present invention, the recessed regions 53R may be formed under the gate electrode 63. That is, the recessed regions 53R do not occupy additional space when viewed in a plan view. Thus, it is easier to ensure sufficient space for arranging the source contact plugs 71, 72, and 73 and the drain contact plugs 75, 76, and 77. Further, a plurality of gate electrodes 63 may be formed on the substrate 51. In this case, the recessed regions 53R do not impede the formation of adjacent gate electrodes 63.

Hereinafter, methods of fabricating a transistor having a recessed active edge according to still another exemplary embodiment of the present invention will be described with reference to FIGS. 11 through 13.

Referring to FIGS. 11 and 12, the methods of fabricating a transistor according to still another exemplary embodiment of the present invention includes forming an isolation layer 58 in a substrate 51 to define an active region 53. Hereinafter, only differences between the present exemplary embodiment and the previous exemplary embodiment described with reference to FIGS. 3 through 7 will be briefly described.

According to this exemplary embodiment of the present invention, at least one recessed region 53R is formed on each of the edges of the active region 53, A bottom 53RB of the recessed region 53R may be sloped down toward the isolation layer 58. Further, the bottom 53RB of the recessed region 53R may be disposed at a lower level than a central top surface of the active region 53.

A gate dielectric layer 61 is formed on the active region 53 having the recessed region 53R. The gate dielectric layer 61 may uniformly cover not only the bottom 53RB of the recessed region 53R but also an exposed surface of the active region 53.

A gate electrode 63 is formed on the substrate 51 having the recessed region 53R and the gate dielectric layer 61. Specifically, a conductive material layer and a hard mask layer may be sequentially formed on the substrate 51 having the recessed region 53R and the gate dielectric layer 61. The conductive material layer may be formed to fill the recessed region 53R and cover the entire surface of the substrate 51. The hard mask layer may be formed of an insulating material having an etch selectivity with respect to the conductive material layer. The hard mask layer and the conductive material layer may be sequentially patterned, thereby forming a hard mask pattern 65 and the gate electrode 63. The gate electrode 63 may be formed to cross over the active region 53 and the recessed region 53R. In this case, the gate electrode 63 may cover a portion of the recessed region 53R. During the formation of the gate electrode 63, the recessed region 53R may be filled with the conductive material layer. In this case, a gate extension 63E may be formed in the recessed region 53R. The gate extension 63E is in contact with the gate electrode 63.

The gate extension 63E may extend on at least one side of the gate electrode 63 when viewed in a plan view. That is, the position of the gate extension 63E may be determined by controlling the size and position of the recessed region 53R. For example, as shown in FIG. 11, the recessed region 53R may extend on both sides of the gate electrode 63, and the gate extension 63E may also extend on both sides of the gate electrode 63.

The height of a top surface "S" of the gate extension 63E can be adjusted by controlling conditions under which the conductive material layer is patterned. In this case, the top surface "S" of the gate extension 63E may be disposed at a lower level than or substantially the same level as the top surface of the substrate 51.

Referring to FIGS. 11 and 13, insulating spacers 67 may be formed on sidewalls of the gate electrode 63 and the hard mask pattern 65. However, the formation of the insulating spacers 67 may be omitted.

A source region 53S and a drain region 53D are formed on the substrate 51 having the gate electrode 63. Specifically, impurity ions may be implanted into the active region 53 using the hard mask pattern 65, the gate electrode 63, and the gate extension 63E as ion implantation masks. The implantation of the impurity ions may be performed using various angles and ion implantation energies. As a result, the source region 53S may be formed in the active region 53 on one side of the gate electrode 63. Also, the drain region 53D may be formed in the active region 53 on the other side of the gate electrode 63. Thus, a channel region is defined between the source and drain regions 53S and 53D. The source and drain regions 53S and 53D may be disposed at a higher level than or substantially the same level as the bottom 53RB of the recessed region 53R. Also, the top surface "S" of the gate extension 63E may be disposed at a lower level than or substantially the same level as top surfaces of the source and drain regions 53S and 53D.

An interlevel dielectric layer 69 may be formed on the substrate 51 having the gate electrode 63, the source region 53S, and the drain region 53D. Source contact plugs 71, 72, and 73 may be formed on the source region 53S through the interlevel dielectric layer 69. Drain contact plugs 75, 76, and 77 may be formed on the drain region 53D through the interlevel dielectric layer 69.

According to this exemplary embodiment of the present invention, the recessed regions 53R may extend on at least one side of the gate electrode 63. The top surface "S" of the gate extension 63E may be disposed at a lower level than or substantially the same level as the top surfaces of the source and drain regions 53S and 53D. Thus, the influence of the recessed regions 53R on the formation of the source contact plugs 71, 72, and 73 and the drain contact plugs 75, 76, and 77 can be minimized. Also, a plurality of gate electrodes 63 may be formed on the substrate 51. Similarly, the influence of the recessed regions 53R on the formation of adjacent gate electrodes 63 can be minimized.

According to the present invention as described above, a recessed region is disposed on an edge of an active region. A bottom of the recessed region may be sloped down toward an isolation layer. A gate electrode is formed to extend in to and fill the recessed region. That is, a gate extension is provided in the recessed region. The channel length of the edge of the active region may be extended due to the depth of the recessed region. The recessed region disposed on the edge of the active region can serve to suppress the occurrence of HEIP. Also, the recessed region is disposed under the gate electrode. Thus, it is possible to ensure sufficient space for arranging source contact plugs and drain contact plugs. Furthermore, the gate extension does not impede the formation of adjacent gate electrodes. As a consequence, a semiconductor device that has an extended effective channel length on the edge of the active region and is appropriate for high integration applications.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims. For example, the present invention can be applied to NMOSFETs and methods of fabricating the same.

What is claimed is:

1. A method of fabricating a semiconductor device, comprising:
    forming an isolation layer in a substrate to define an active region;
    forming a recessed region on at least one edge of the active region adjacent to the isolation layer, the recessed region having a first top surface lower than a second top surface of a central portion of the active region;
    forming a gate electrode crossing over the active region; and
    forming a source region and a drain region in the active region on both sides of the gate electrode, respectively,
    wherein a top surface of the active region has a first length between the source region and the drain region crossing the recessed region longer than a second length between the source region and the drain region crossing the central point,
    wherein a first channel length of the at least one edge of the active region is longer than a second channel length of the central portion, and
    wherein a gate extension is formed in the recessed region to contact the gate electrode.

2. The method according to claim 1, wherein forming the recessed region comprises:
    forming a mask pattern on the active region and the isolation layer; and
    selectively removing the edge of the active region using the mask pattern as an etch mask,
    wherein a bottom of the recessed region is sloped down toward the isolation layer.

3. The method according to claim 2, wherein a portion of the isolation layer is removed with the edge of the active region.

4. The method according to claim 1, wherein the recessed region is formed to a smaller size than the resolution limit in a photolithography process.

5. The method according to claim 1, before forming the gate electrode, further comprising forming a gate dielectric layer to cover an inner wall of the recessed region and a surface of the active region.

6. The method according to claim 1, wherein forming the gate electrode comprises:
    forming a conductive material layer on the substrate having the recessed region; and
    patterning the conductive material layer,
    wherein the gate extension is left in the recessed region.

7. The method according to claim 1, wherein the gate electrode is formed to completely cover the recessed region.

8. The method according to claim 1, wherein the gate electrode is formed to cover a portion of the recessed region.

9. The method according to claim 8, wherein the gate extension extends on at least one side of the gate electrode, and wherein a top surface of the gate extension is disposed lower than or at substantially the same level as top surfaces of source and drain regions.

10. The method according to claim 1, wherein the source and drain regions are disposed higher than the bottom of the recessed region.

11. The method according to claim 1, wherein forming a recessed region on at least one edge of the active region includes forming a first recessed region on a first edge of the active region and forming a second recessed region on a second edge of the active region opposite the first edge.

12. The method of claim 11, wherein each of the first and second recessed regions include a plurality of recessed portions.

* * * * *